(12) United States Patent
Miller et al.

(10) Patent No.: US 6,703,869 B2
(45) Date of Patent: Mar. 9, 2004

(54) METHOD AND APPARATUS FOR LOW LATENCY DISTRIBUTION OF LOGIC SIGNALS

(75) Inventors: Darrin C. Miller, Fort Collins, CO (US); Brian C Miller, Fort Collins, CO (US); Robert H Miller, Jr., Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 21 days.

(21) Appl. No.: 10/164,169

(22) Filed: Jun. 5, 2002

(65) Prior Publication Data

US 2003/0227298 A1 Dec. 11, 2003

(51) Int. Cl.[7] ............................................... H03K 19/20
(52) U.S. Cl. ........................... 326/104; 326/21; 326/22; 326/101
(58) Field of Search .............................. 326/21, 22, 26, 326/30, 82, 86, 90, 93, 101, 104

(56) References Cited

U.S. PATENT DOCUMENTS 6,373,288 B1 * 4/2002 Ganzemi et al. .............. 326/93
6,462,599 B2 * 10/2002 Nitta et al. .................. 327/292

* cited by examiner

*Primary Examiner*—Anh Tran (57) ABSTRACT

A series of logic clouds is used to distribute and propagate signals traveling a relatively long distance across a data logic circuit fabric. One or more long distance signals originate from an initial logic cloud that may be located on a source data block and pass through a series of logic clouds that may be located on an intermediate data block before passing through a destination logic cloud located on a destination data block. Each logic cloud reads both stabilized logic signals and long distance signals and employs a NAND gate connected with an inverter to perform not only logical operations but also to act as a repeater between the logic clouds. The stabilized logic signals may represent signals that originate from other sources along a given data path.

27 Claims, 9 Drawing Sheets

FROM FIG. 4

METHOD AND APPARATUS FOR LOW LATENCY DISTRIBUTION OF LOGIC SIGNALS

TECHNICAL FIELD

The technical field is in communication between different parts of an integrated data logic circuit.

BACKGROUND

Data logic circuits often require signals to travel relatively long distances on a chip or on a given circuit fabric. Faster architecture and chip requirements increase the need for faster processing between points on the given circuit or chip. In addition, as the relative distances that signals travel increase, there is a greater need to avoid latency or signal degradation.

One possible approach to solving such problems is to make use of registers along a long distance signal data path. In this approach, an input register first transmits the long distance signal to an intermediate register where the long distance signal is stored temporarily and then transmitted again to a final output register. Although using registers preserves integrity and signal strength, relaying data using registers requires an additional clock cycle to store the data into the intermediate register. This additional clock cycle causes an additional delay in transmitting the long distance signal from the input register to the output register.

Another potential solution is to route all of the signals from different parts of a given chip or circuit fabric to a single multiplexer (or mux), and then to multiplex the signals from the mux to appropriate destination points on the chip or circuit fabric. Multiplexing the signals would allow for a topologically simple way of transmitting the long distance signal, but at the expense of requiring more routing and more data combinations. The increased amount of routing and data combinations would both delay the long distance signal as the long distance signal is transmitted from the input register to the output register.

SUMMARY

A series of logic "clouds" that are connected to each other are used to provide logical functions and to propagate a long distance signal along a circuit fabric or chip. An initial logic cloud reads the signal from an input register, then buffers and repeats the signal before transmission through a series of "middle" logic clouds. The middle logic clouds may include any number of circuit connections, but every logic cloud passes the signal through a NAND-inverter combination before transmitting the signal through a connector circuit to the next logic cloud. The long distance signal passing through from the input cloud will be logically NANDed with at least one other signal, with the NANDed signal feeding into an inverter. The inverted long distance signal then feeds into the connector circuit and passes to the next logic cloud. The long-distance signal may be delayed arriving at the logic cloud and may not have reached a steady state as quickly as the other signals that are being NANDed with the long distance signal.

The NAND-inverter combination effectively performs a logical AND operation on the long distance signal and also performs a repeating operation on the long distance signal. The repeating arises from the combination of the NAND and the inverter gates. After passing through the logic clouds, the signal is passed through an end logic cloud and a destination logic cloud in which the signal is repeated and buffered before being driven into an output register.

Each chip or circuit fabric may contain a multiple number of logic clouds and different data pathways that use logic clouds. In addition, each logic cloud may include other logic gates and branches from the main circuit path, but all may have a NAND-inverter combination for propagating the signal between logic clouds.

A corresponding method is disclosed in which an input signal is propagated with both logical combination and repeating. An input signal, which is the long distance signal, is read from an input register and first buffered. The buffered signal is then repeated before the buffered signal is transmitted to the first NAND-inverter combination, where the signal is NANDed with a local signal that has reached a steady state and then inverted. The long distance signal has now become a pathway input signal to a path of one or more NAND-inverter combinations.

The method for propagation across a long distance begins when the pathway input signal, which is often the long distance signal, is first NANDed with at least one local signal that has reached a steady state. The pathway input signal is then inverted to form an intermediate output signal, which has higher drive strength than the pathway input signal. The intermediate output signal may be fed back as the pathway input signal for other NAND-inverter combinations that in turn would use the subsequent intermediate output signal as the pathway input signal for the next NAND-inverter combination. A first final intermediate output signal is produced once the long distance signal is fed through all of the given NAND-inverter combinations on a given intermediate block. The long distance signal may be combined with a number of other circuit elements as it is NANDed and inverted along the long distance signal's logical path.

Once the long distance signal has completed the journey across the intermediate block, a final series of logical combinations occur. The long distance signal is first electronically repeated to boost the signal strength and is then buffered to condition the long distance signal. The long distance signal is then transmitted into the output register, where it may be retrieved.

DETAILED DESCRIPTION OF THE DRAWINGS

DETAILED DESCRIPTION

Figure 1A:
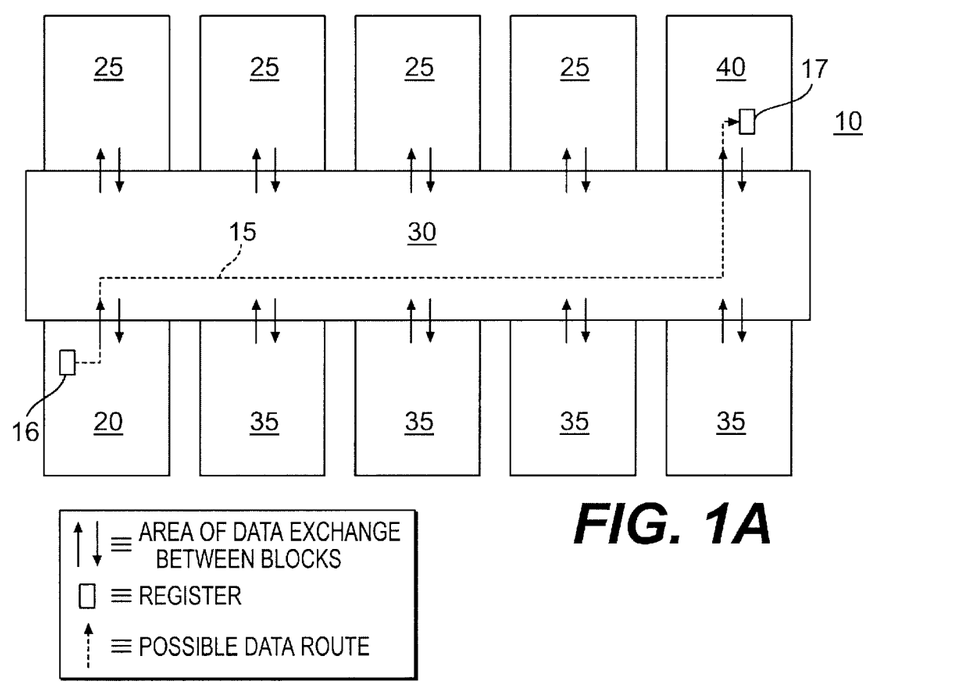
FIG. 1A illustrates a sample long distance signal path between different data blocks on a given chip.

FIG. 1A illustrates a sample data circuit layout 10. The data circuit layout 10 is divided into three major sections, including a source data block (or source block) 20, an intermediate data block (or intermediate block) 30 and a destination data block (or destination block) 40. Each data block may include a multiplicity of logical devices and circuits. The data circuit layout 10 may also include a number of other similar data blocks in addition to the source data block 20, the intermediate data block 30 and the destination data block 40, which are provided for illustrating the invention. The data circuit layout 10 of FIG. 1A includes auxiliary "north side" blocks 25 in addition to the destination data block 40 and auxiliary "south side" blocks 35 in addition to the source data block 20. A long distance signal 15 traveling the data path as shown between the source data block 20 to destination data block 40 as shown exemplifies a longest path between a north side block and a south side block through the intermediate block 12.

Figure 1B:
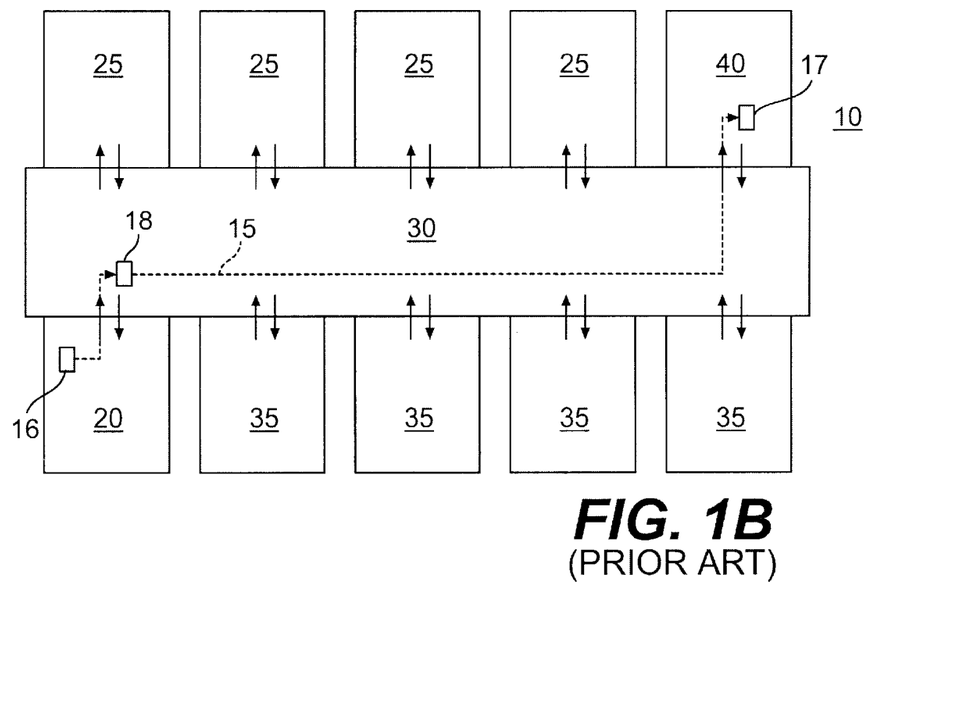
FIG. 1B illustrates a prior art method of transmitting data between the different data blocks on the chip of FIG. 1A.

Referring to FIG. 1B, one prior art method for propagating the long distance signal 15 is to use a system of registers as discussed above. In this prior art system, the long-distance signal 15 emerges from an input register 16 in source block 20. The long-distance signal 15 may then be transmitted to an intermediate register 18 on intermediate block 30, where the long distance signal 15 is then transmitted a second time to an output register 17 on destination block 40. For the reasons given above, this prior art data path requires an additional clock cycle to store the data in the intermediate register 18 and thus delays the transmission of data from source block 20 to destination block 40.

Figure 2A:
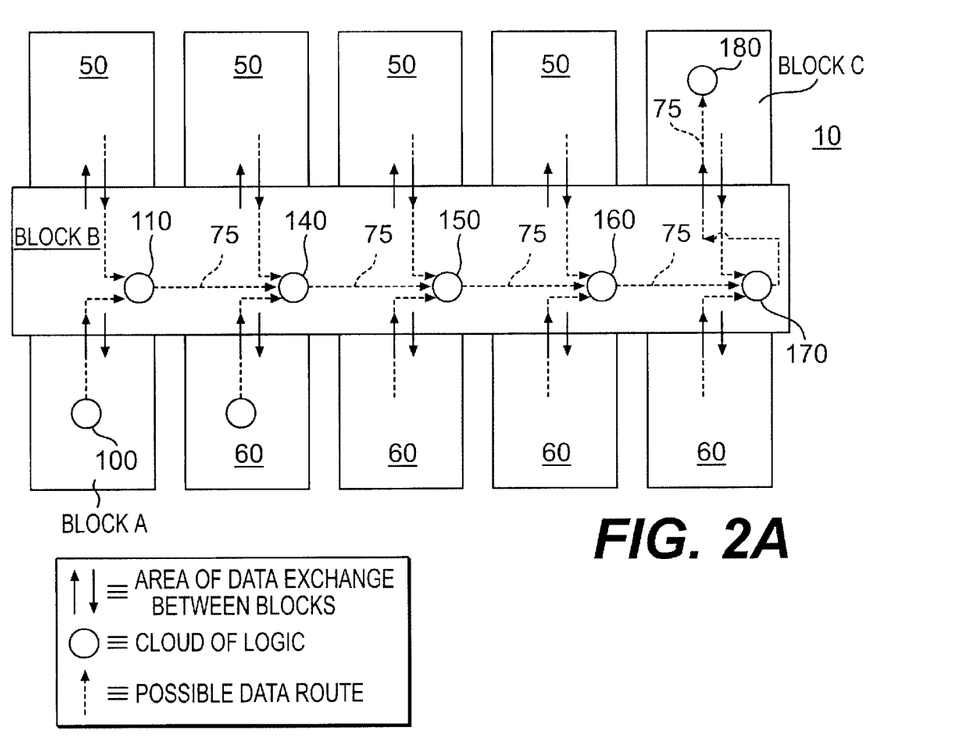
FIG. 2A illustrates one embodiment of logic clouds that are used to transmit a signal across the circuit path from source block A through intermediate block B to destination block C.

To speed up the data transmission of a long distance signal, a series of logic "clouds" may be employed to facilitate data transfer from source block 20 to destination block 40. Referring to FIG. 2A, a long distance signal 75 originates from source logic cloud 100 on a source block A and passes through five other logic clouds 110, 140, 150, 160, 170 on an intermediate block B. A destination block C includes a destination logic cloud 180 that incorporates an output register 90. (See FIG. 3). Each of these logic clouds 100, 110, 140, 150, 160, 170, 180 may contain one or more logic gates or other circuit components that in tandem allow for amplification and a signal integrity along the data path. Moreover there is no need for an additional clock cycle to store the data in an intermediate register.

Figure 3:
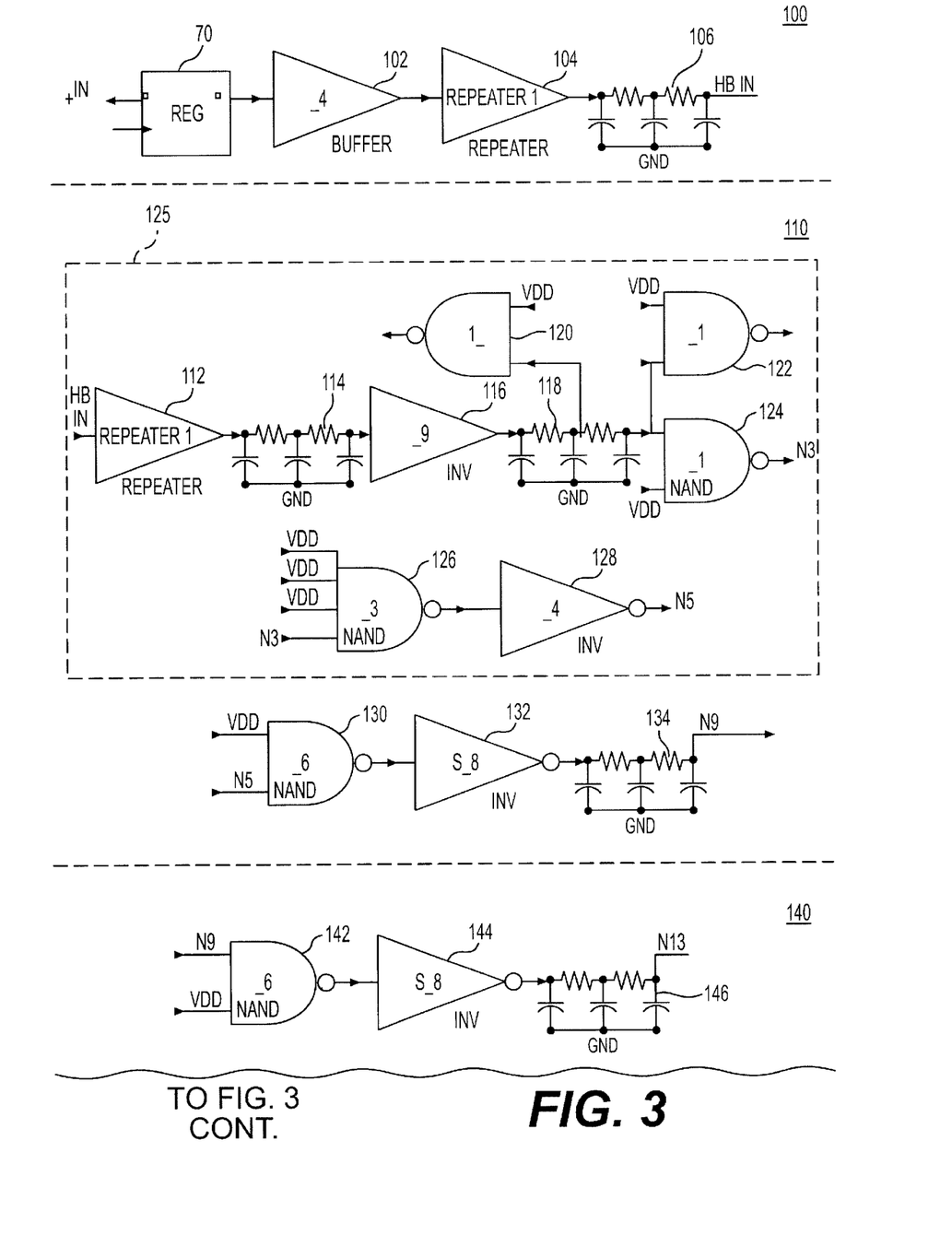
FIG. 3 is a schematic representation of the different logic clouds found in the long distance signal data path in FIG. 2A.

FIG. 3 illustrates the logic clouds 100, 110, 140, 150, 160, 170, 180 in greater detail. The source logic cloud 100 includes the input register 70 from which the long distance signal 75 originates and which is connected to an input buffer 102. The input buffer 102 subsequently connects into an input repeater 104. The input repeater 104 may then feed into a connector section 106, which is represented in the diagrams as an RC (resistor-capacitor) circuit to illustrate a delay that will naturally occur in the connector section 106. The connector section 106 may be any type of wire conductor and may include one or more RC circuits. However, the RC circuits are merely illustrative of the delay that may occur in the connector section 106.

The initial logic cloud 110 includes a logic subcloud 125. The logic subcloud 125 features a logic subcloud repeater 112 that is connected to a first connector section 114 and in turn connected to a drive strength 9 ("_9") inverter 116 (e.g., an inverter with a drive strength of 9). (The drive strength of the logic gates are illustrated with an underbar symbol ("_") followed by the drive strength number, such as _1 representing a drive strength of 1. The drive strength increases with an increasing drive strength number, so that a drive strength of 1 is weak while a drive strength of 9 is strong. A second connector section 118 connects to the _9 inverter 116 and feeds into a _1 NAND gate 124. The _1 NAND gate 124 reads a steady-state signal, represented by "VDD", in addition to the output of the _9 inverter 116.

A _3 NAND gate 126 reads the output of the _1 NAND gate 124 as an input, along with a plurality of steady state signals labeled as VDD. (In all of these drawings, NAND gates are illustrated as being connected with an n-number, such as n3, n5, n9 and n13, which represents the data path of the long distance signal 75. VDD signals represent signals that travel a shorter distance and that have theoretically reached a steady-state before the long-distance signal. The _3 NAND gate 126 in subcloud 125 feeds into a _4 inverter 128. The output of the _4 inverter 128 then serves as the output of the logic subcloud 125. The logic subcloud 125 connects into an _6 NAND gate 130 that subsequently connects into a s_8 inverter (i.e. an S-inverter with a drive strength of 8) 132. (An S-inverter is a symmetric inverter, where output rise and fall times for the S-inverter are more balanced than for a non-symmetric inverter. A non-symmetric inverter may be used in the invention as well). The s_8 inverter 132 then feeds into a connector section 134 that completes the initial logic cloud 110 and that connects initial logic cloud 110 to logic cloud 140.

The "middle" logic clouds 140, 150, 160 illustrated in FIG. 3 may include some or all of the same circuit elements found in initial logic cloud 110, but all of the middle logic clouds 140, 150, 160 have at least one NAND-inverter combination. For example, the middle logic cloud 140 includes a NAND 142 connected to an inverter 144 that is subsequently connected to a connector circuit 146 that connects to the next middle logic cloud 150. Likewise, middle logic cloud 150 includes a NAND gate 152 that is connected to an inverter 154, which is further connected to another connector circuit 156 for transmitting the signal from middle logic cloud 150 to middle logic cloud 160. Middle logic cloud 160 has a similar structure. All of the middle logic clouds 140, 150, 160 may have any number of different circuit elements in addition to the circuits explicitly illustrated in FIG. 3, but all of the logic clouds 140, 150, 160 have NAND-inverter combinations that at their respective junction points to their connector circuits 146, 156, 166.

The end cloud 170 represents the last logic cloud on intermediate block B that the long distance signal 75 passes through before entering the destination block C. The end cloud 170 differs somewhat from the middle logic clouds 140, 150, or 160. The end cloud 170 includes a NAND gate 172 connected to a repeater 174. The repeater 174 connects to another connector section 176 that is connected to destination cloud 180.

The destination logic cloud 180 includes a final repeater 182 connected to a connector section 184 and a destination buffer 186. The destination buffer 186 connects to the output register 90, where data may be stored for later retrieval.

Figure 5A:
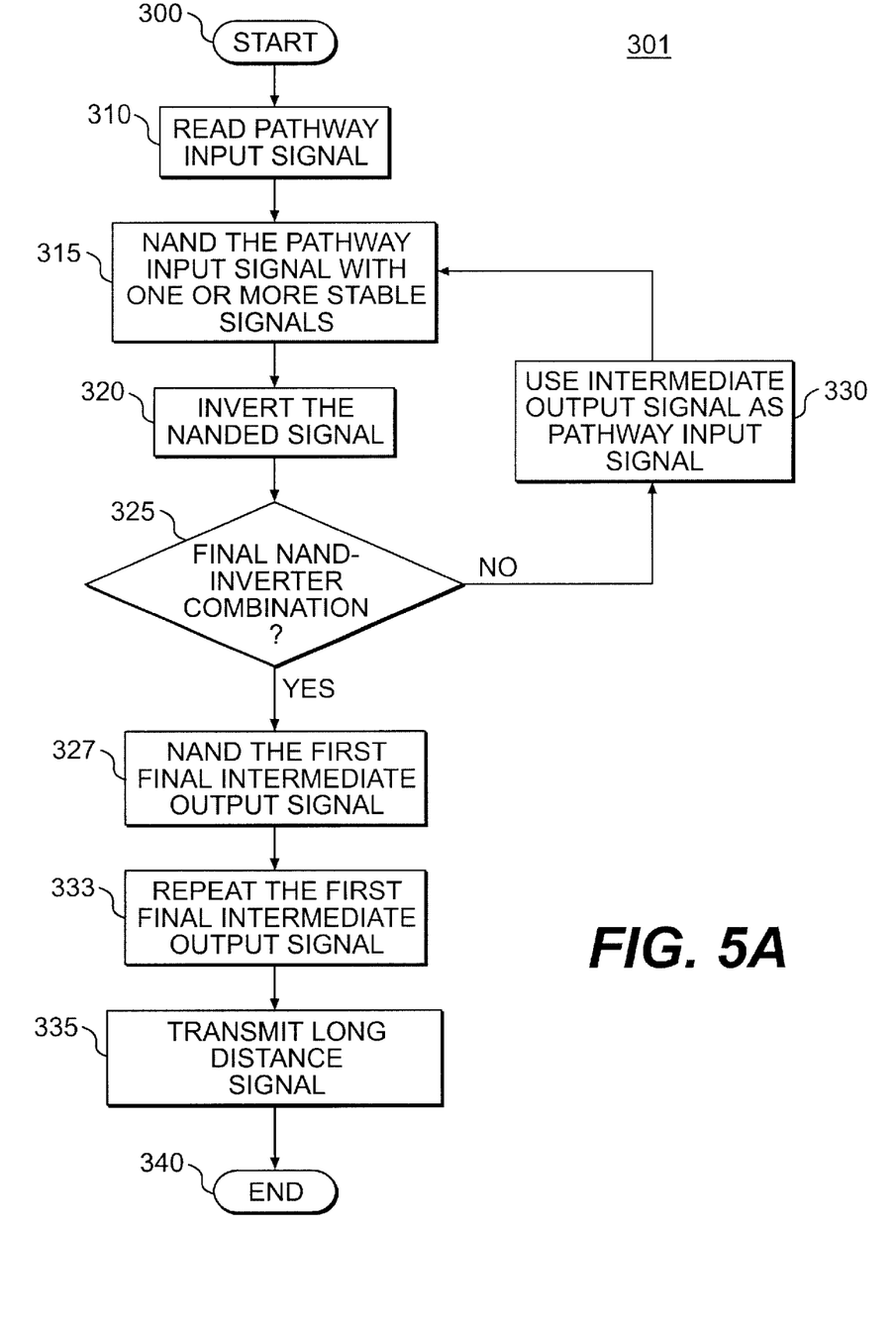
FIG. 5A is a flowchart illustrating a method of transmitting the signal through the circuit path using logic clouds.
Figure 5B:
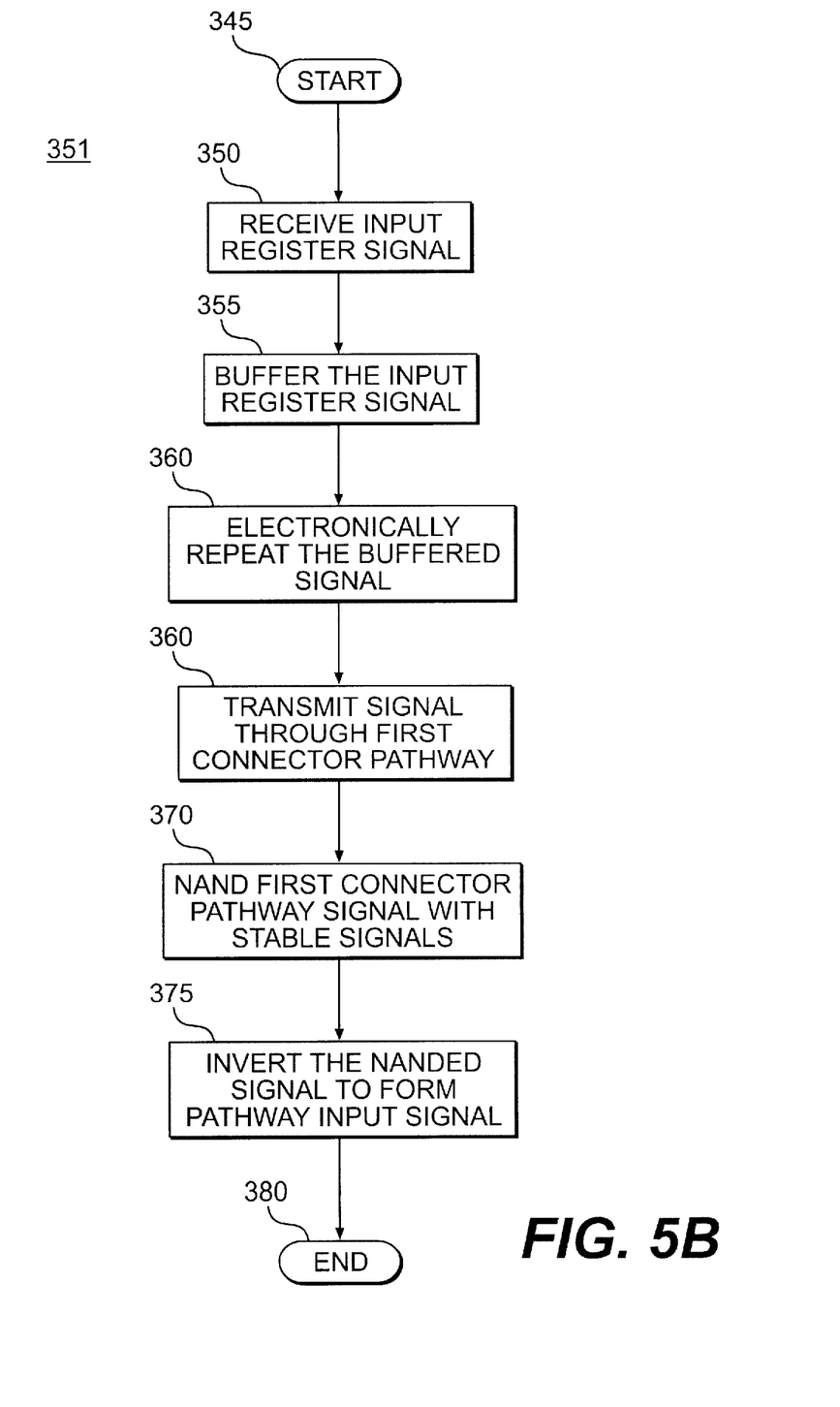
FIG. 5B is a flowchart illustrating a method for processing and conditioning the signal prior to being transmitted through the circuit path.

Referring to FIGS. 2A, 3 and 5B, the long distance signal 75 originates from the source logic cloud 100. A method 351 for pre-processing the long distance signal begins when the long distance signal 75 originates from the input register 70 as an input register signal (step 350). Referring to FIG. 5B, the long distance signal 75 is first buffered (step 355) and then repeated (step 360) as the long distance signal 75 emerges from source logic cloud 100. The long distance signal 75 then passes through the initial logic cloud 110 and logic subcloud 125. Within the logic subcloud 125, the long distance signal 75 passes through two different NAND gates in which the long distance signal 75 is NANDed with other shorter-distance stable signals that emerge from either the intermediate block B, one of the north side blocks 50 or one of the south side blocks 60. The long distance signal 75 may be NANDed with these shorter distance and other stable data signals (step 370) and then inverted (step 375) before exiting the logic subcloud 125.

The NAND-inverter combinations provide a method 301 for both logically combining the long distance signal 75 and repeating the resulting signal. Referring to FIG. 5A, the long distance signal 75 is read in as a pathway input signal (step 310). The pathway input signal is then NANDed with at least one other signal (VDD), which will generally be a shorter distance or local signal that has reached a stable state signal (step 315). The long distance signal 75, which has now been NANDed, is then inverted to produce an intermediate output signal (step 320). The combination of NANDing and inverting allows for both logically combining the long distance signal 75 with shorter distance signals (VDD) as well as repeating the long distance signal 75, which is now an intermediate output signal.

The long distance signal may be NANDed and inverted multiple times in succession. For example, the method may check to see whether this first NAND-inverter combination is the final combination (step 325). If this first NAND-inverter combination is not the final combination, the method may proceed to feed in the intermediate output signal as the next pathway input signal (step 330) and repeat the process. A first final intermediate output signal is produced once the final NAND-inverter combination has been reached (step 325). This first final intermediate output signal is the long distance signal 75 after the long distance signal 75 has undergone a series of logical combination and repeating on the intermediate block B.

The long distance signal 75 may pass through other circuit elements in middle logic clouds 140, 150, 160 other than NAND-inverter combinations. The NAND-inverter combinations, though, serve as the common element between the different logic clouds 140, 150, 160.

The long distance signal 75 passes through one final NAND operation after reaching end logic cloud 170 (step 327), which is still on the intermediate block B. After the final NAND operation, the long distance signal 75 passes through a repeater 174 (step 333) to form a second intermediate output signal. The long distance signal 75 has now undergone all logical operations and is ready to be sent to the signal's final destination off of the intermediate block B. The long distance signal 75 (at this point equivalent to the second final intermediate output signal) is then transmitted to the destination logic cloud 180 (step 335), ending the method 301.

Figure 5C:
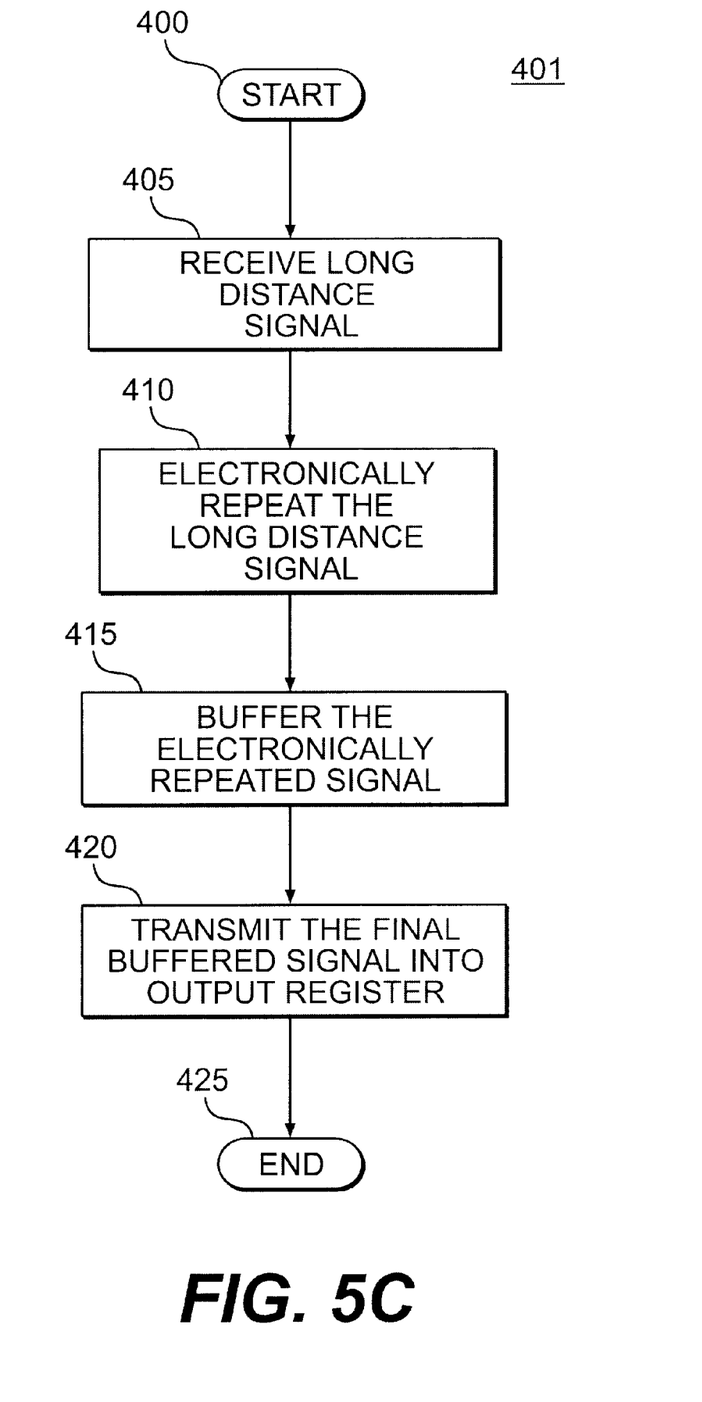
FIG. 5C is a flowchart illustrating a method of processing the signal after being transmitted through the circuit path.

Referring to FIGS. 2A and 3, the long distance signal 75 reaches the destination logic cloud 180 on destination block C after exiting block B. At this point, the long distance signal 75 undergoes a final signal conditioning 401 (See FIG. 5C). The long distance signal 75 is first repeated (step 410) through the final repeater 182 to boost the signal strength prior to feeding into a final connector section 184. The long distance signal 75 is then buffered (step 415). The final buffered long distance signal is then transmitted or driven into the output register 90 (step 420), ending the journey of the long distance signal 75. The output register 90 may hold data from the long distance signal 75 for retrieval at a later time. In this way, the long distance signal 75 may be transmitted from source block A to destination block C without needing to store the signal 75 in an intermediate register.

Figure 2B:
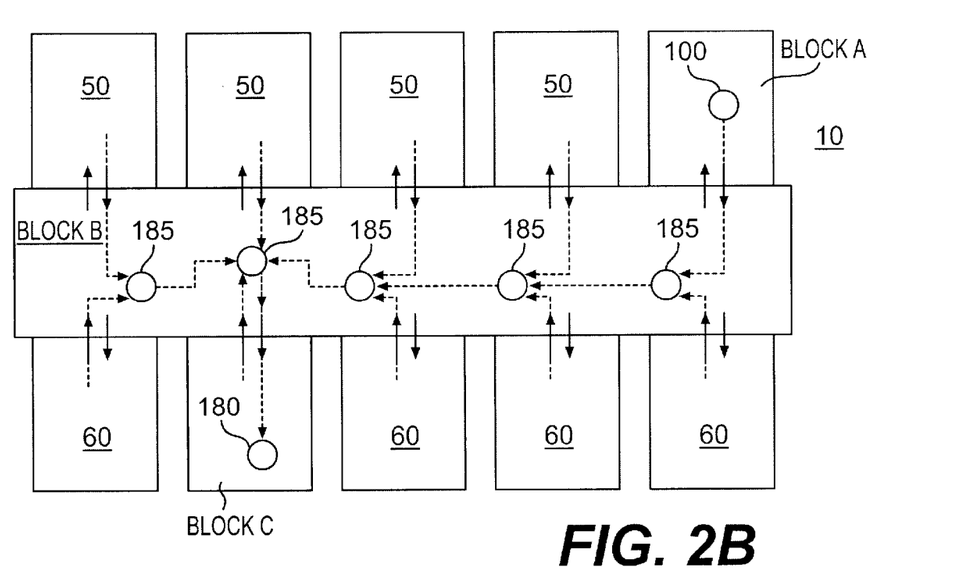
FIG. 2B illustrates a second embodiment of the invention where logic clouds are used to transmit a signal through a different circuit path than that shown in FIG. 2A.

The long distance signal 75 illustrated in FIG. 2A used one possible data path with NAND-inverter combinations to pass data through long distances on the data circuit layout 10 that may be found on a given circuit fabric, chip, or data architecture. A data circuit layout 10 could include a plurality of long distance signals 75 traveling through a number of different paths of logic clouds. Referring to FIG. 2B, different combinations may be used, and different logic clouds 185 may be used for data paths that are not necessarily the longest path between points on a given data circuit layout.

Figure 4:
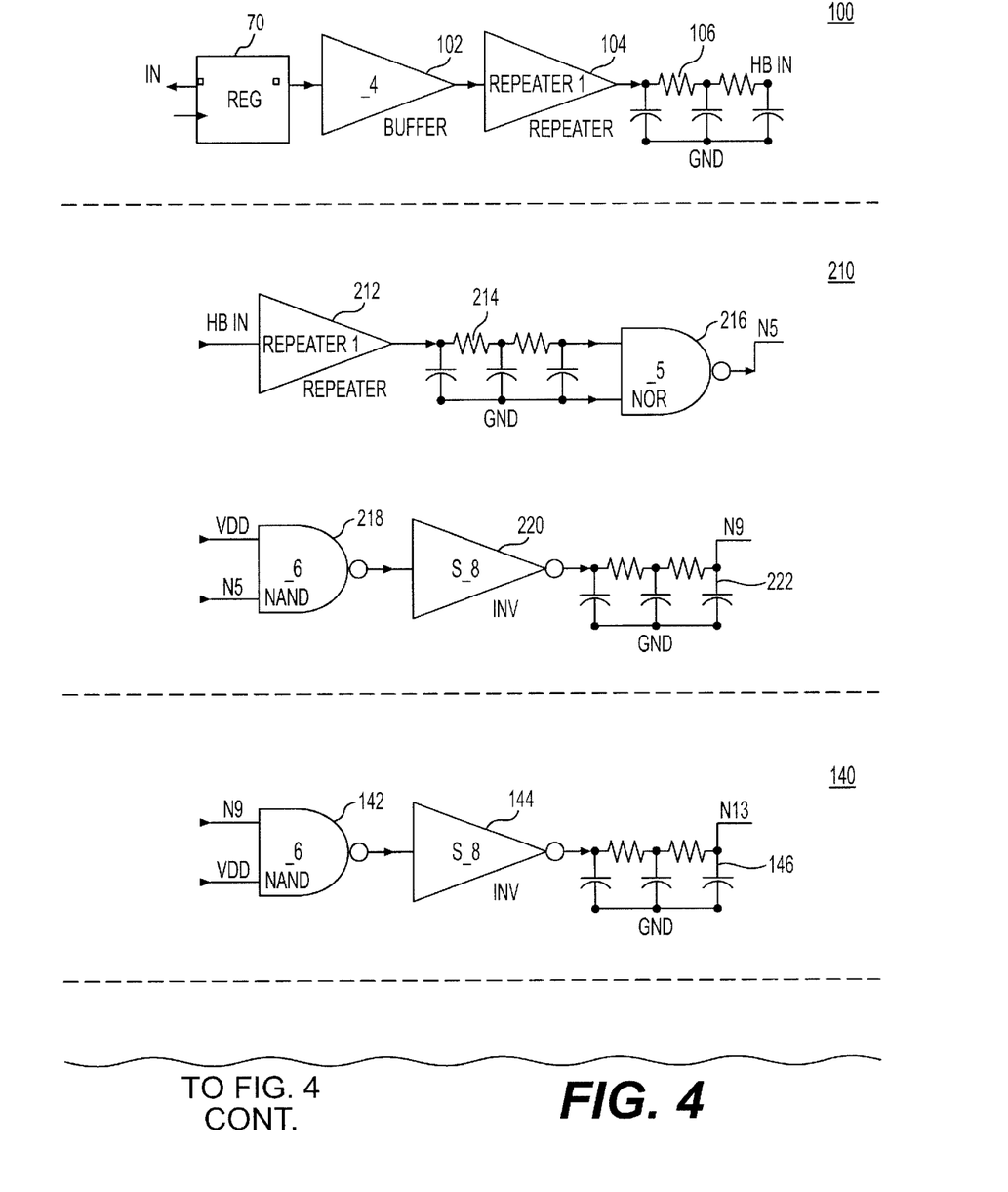
FIG. 4 is a schematic representation of an alternate set of logic clouds for the same data path found in FIG. 2A.

Furthermore, different logic may be used in each of the logic clouds 100, 110, 140, 150, 160, 170 and 180, as is required by different types of architectures and different logic specifications. For example, in FIG. 4 a different "second" cloud 210 includes a repeater 212 and a connector section 214 but a NOR gate 218 that feeds a different n5. The rest of the circuitry illustrated in FIG. 4 is essentially identical to that illustrated in FIG. 3. As in the circuitry of FIG. 3, an NAND gate plus an inverter provides both repeating of the signal and logical functions without requiring the use of standalone repeaters or buffers.

The terms and descriptions used herein are set forth by way of illustration only and are not meant as limitations. Those skilled in the art will understand that numerous variations are possible within the spirit and scope of the invention as defined in the following claims—and their equivalents—in which all terms are to be understood in the broadest reasonable sense.

What is claimed:

1. A logic circuit path for low latency distribution of logic signals, comprising:
   a first NAND-inverter combination capable of receiving a plurality of input signals, wherein one or more of the input signals is a delayed long-distance signal, and wherein the NAND-inverter combination comprises:
     a NAND gate that receives the plurality of input signals including the one or more delayed long distance signals, and
     an inverter that receives an output of the NAND gate, wherein an output signal of the NAND-inverter combination comprises an output of the inverter; and
   a connector section connected to the first NAND-inverter combination, wherein the connector section receives the output signal of the first NAND-inverter combination and wherein the connector section transmits an intermediate signal and wherein the connector section comprises at least one RC circuit.

2. The logic circuit path of claim 1, wherein the connector section creates a transmission delay.

3. The logic circuit path of claim 1, further comprising:
   a second NAND-inverter combination connected to the first NAND-inverter combination, wherein one of the input signals is an output of the first NAND-inverter combination.

4. A logic circuit path for low latency distribution of logic signals, comprising:
   a first NAND-inverter combination capable of receiving a plurality of input signals, wherein one or more of the input signals is a delayed long-distance signal, and wherein the NAND-inverter combination comprises:
     a NAND gate that receives the plurality of input signals including the one or more delayed long distance signals, and
     an inverter that receives an output of the NAND gate, wherein an output signal of the NAND-inverter combination comprises an output of the inverter;

an input register capable of receiving a source input signal;

an input buffer connected to the output of the input register, whereby the input buffer conditions the source input signal;

an input repeater connected to the output of the input buffer; and an input block connector section connected to the input repeater, wherein the input block connector section connects into the first NAND-inverter combination.

5. The logic circuit path of claim 4, wherein the input block connector section includes one or more RC circuits.

6. The logic circuit path of claim 4, wherein the logic circuit path further comprises:

a series of circuit path segments, wherein each circuit path segment comprises:

a NAND gate that receives as one input the intermediate input signal;

an inverter connected to the output of the NAND gate; and a segment connector section connected to the inverter that produces an intermediate output signal, wherein the intermediate output signal of one circuit path segment is connected to the intermediate input signal of the next circuit path segment.

7. The logic circuit path of claim 5, wherein the segment connector section further includes one or more RC circuits.

8. The logic circuit path of claim 5, further comprising:

an end cloud NAND gate connected to one of the circuit path segments;

an end cloud repeater connected to the end cloud NAND gate; and an end cloud connector connected to the end cloud repeater.

9. The logic circuit path of claim 8, wherein the end cloud connector includes an RC circuit.

10. The logic circuit path of claim 5, further comprising:

a destination repeater connected to one of the circuit path segments;

a destination connector section connected to the destination repeater;

a destination buffer connected to the destination connector section; and a destination register connected to the destination buffer.

11. The logic circuit path of claim 10, wherein the destination connector section includes an RC circuit.

12. The logic circuit path of claim 10, further comprising a logic subcloud, capable of receiving an input, connected between the input block wire section and the first NAND-inverter combination.

13. The logic circuit path of claim 12, wherein the logic subcloud further comprises:

a logic subcloud repeater connected to the input of the logic subcloud;

a logic subcloud first connector section connected to the logic subcloud repeater;

a logic subcloud first inverter connected to the logic subcloud first connector section;

a logic subcloud second connector section connected to the logic subcloud first inverter;

a logic subcloud first NAND gate, wherein an input of the logic subcloud first NAND gate is connected to the logic subcloud second connector section;

a logic subcloud second NAND gate, wherein an input of the logic subcloud second NAND gate is connected to an output of the logic subcloud first NAND gate; and a logic subcloud second inverter connected to the logic subcloud second NAND gate, wherein an output of the logic subcloud comprises the output of the logic subcloud second inverter.

14. The logic circuit path of claim 13, wherein the logic subcloud first connector section further includes an RC circuit.

15. The logic circuit path of claim 13, further comprising an auxiliary circuit branch that connects to the logic subcloud first connector section.

16. The logic circuit path of claim 13, further comprising an auxiliary circuit branch that connects to the logic subcloud second connector section.

17. A method for transmitting a signal along a logical path comprising:

(a) receiving a pathway input signal;

(b) logically NANDing the pathway input signal with one or more local signals to form a NAND output signal;

(c) logically inverting the NAND output signal to form an intermediate output signal;

repeating steps (a)–(c) with another one or more stable signals for one or more iterations to produce a first final intermediate output signal, wherein the intermediate output signal of a given iteration is fed into the pathway input signal for the successive iteration;

reading an initial input signal from the input register;

buffering the initial input signal;

electronically repeating the buffered input register signal;

transmitting the electronically repeated signal through a first connector pathway;

logically NANDing the signal received from the first connector pathway with one or more stable signals; and logically inverting the NANDed signal, wherein the inverted signal feeds into the pathway input signal.

18. A method for transmitting a signal along a logical path comprising:

(a) receiving a pathway input signal;

(b) logically NANDing the pathway input signal with one or more local signals to form a NAND output signal;

(c) logically inverting the NAND output signal to form an intermediate output signal;

repeating steps (a)–(c) with another one or more stable signals for one or more iterations to produce a first final intermediate output signal, wherein the intermediate output signal of a given iteration is fed into the pathway input signal for the successive iteration;

logically NANDing the first final intermediate output signal; and repeating the first final intermediate output signal to form a second final intermediate output signal.

19. The method of claim 18, further comprising:

(d) transmitting the intermediate output signal through a first connector pathway.

20. The method of claim 18, further comprising:

repeating the second final intermediate output signal;

buffering the repeated intermediate output signal forming a final buffered signal; and transmitting the final buffered signal into an output register.

21. The method of claim 18, further comprising distributing the first final intermediate output signal to one or more circuit elements.

22. A circuit path for low latency distribution of logic signals, comprising:

a first means for logically combining a plurality of input signals, wherein one or more of the input signals is a delayed long distance signal, and wherein a means for logically combining a plurality of input signals comprises:
  means for NANDing the plurality of input signals;
  means for inverting an output of the NANDing means, wherein the output of the inverting means becomes an output of the means for logically combining the plurality of input signals;
means for receiving a source input signal;
means for storing the received signal;
means for buffering the stored signal;
means for repeating the buffered signal; and
means for conducting the repeated signal to the first means for logically combining the plurality of input signals.

23. The circuit path of claim 22, wherein the output of the first means for logically combining connects into one or more additional means for logically combining, wherein each means for logically combining connects to a subsequent means for logically combing until a final means for logically combining is reached.

24. The circuit path of claim 23, further comprising a final logical processing means, wherein the final logical processing means comprises:
  means for NANDing the signal from the final means for logically combining; and
  means for repeating the NANDed signal to produce an output signal of the final logical processing means.

25. The circuit path of claim 24, further comprising:
  means for repeating the output signal from the final logical processing means;
  means for buffering the repeated signal; and
  means for storing the buffered signal.

26. The circuit path of claim 22, further comprising:
  means for branching off the circuit path.

27. The circuit path of claim 22, further comprising:
  means for logically combining a signal from the circuit path with at least one other signal.

* * * * *